(12) United States Patent
Carter et al.

(10) Patent No.: US 11,020,955 B2
(45) Date of Patent: Jun. 1, 2021

(54) CONTROL OF SOLIDIFICATION IN LASER POWDER BED FUSION ADDITIVE MANUFACTURING USING A DIODE LASER FIBER ARRAY

(71) Applicant: General Electric Company, Schenectady, NY (US)

(72) Inventors: William Thomas Carter, Galway, NY (US); Marshall Gordon Jones, Scotia, NY (US); Lang Yuan, Niskayuna, NY (US); Ning Zhou, Clifton Park, NY (US); Steven Jude Duclos, Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 16/704,831

(22) Filed: Dec. 5, 2019

(65) Prior Publication Data

US 2020/0180297 A1 Jun. 11, 2020

Related U.S. Application Data

(63) Continuation of application No. 15/014,713, filed on Feb. 3, 2016, now Pat. No. 10,532,556, which is a
(Continued)

(51) Int. Cl.
*B33Y 80/00* (2015.01)
*B23K 26/00* (2014.01)
(Continued)

(52) U.S. Cl.
CPC .............. *B33Y 80/00* (2014.12); *B22F 5/009* (2013.01); *B22F 5/04* (2013.01); *B22F 12/00* (2021.01);
(Continued)

(58) Field of Classification Search
CPC ..................................................... B33Y 80/00
See application file for complete search history.

(56) References Cited

U.S. PATENT DOCUMENTS 5,508,489 A 4/1996 Benda et al.
5,672,464 A 9/1997 Nelson
(Continued)

FOREIGN PATENT DOCUMENTS

CN 1593817 A 3/2005
CN 101376971 A 3/2009
(Continued)

OTHER PUBLICATIONS

Paschotta, Dr. R., "Encyclopedia of laser physics and technology—Laser diodes, semiconductor, gain, index guiding, high power," Retrieved from the Internet URL https://www.rp-photonics.com/laser_diodes.html, last visited Dec. 5, 2019.
(Continued)

*Primary Examiner* — Larry W Thrower
(74) *Attorney, Agent, or Firm* — Dority & Manning, P.A.

(57) ABSTRACT

A method of method of forming or repairing a superalloy article having a columnar or equiaxed or directionally solidified or amorphous or single crystal microstructure includes emitting a plurality of laser beams from selected fibers of a diode laser fiber array corresponding to a pattern of a layer of the article onto a powder bed of the superalloy to form a melt pool; and controlling a temperature gradient and a solidification velocity of the melt pool to form the columnar or single crystal microstructure.

20 Claims, 7 Drawing Sheets

Figure 1A:
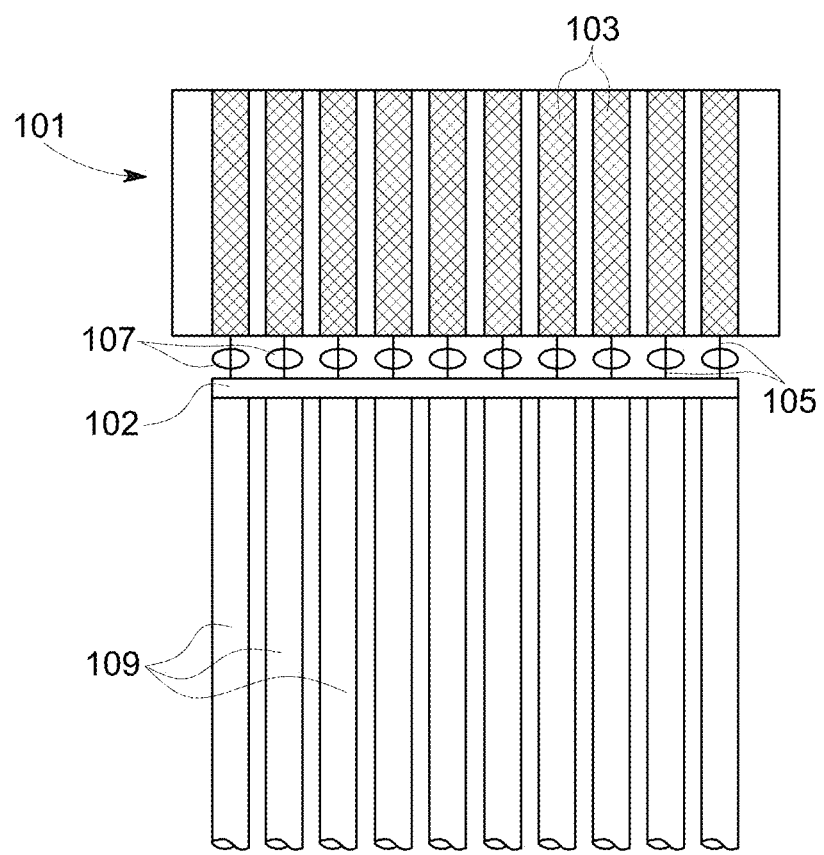

Related U.S. Application Data continuation-in-part of application No. 14/106,970, filed on Dec. 16, 2013, now Pat. No. 10,328,685.

(51) Int. Cl.

| | | |
|---|---|---|
| *B23P 6/00* | (2006.01) | |
| *B33Y 10/00* | (2015.01) | |
| *B29C 73/34* | (2006.01) | |
| *B33Y 30/00* | (2015.01) | |
| *B23K 26/06* | (2014.01) | |
| *B29C 73/00* | (2006.01) | |
| *B23K 26/073* | (2006.01) | |
| *B23K 26/34* | (2014.01) | |
| *B22F 5/00* | (2006.01) | |
| *B28B 1/00* | (2006.01) | |
| *F01D 5/00* | (2006.01) | |
| *B22F 5/04* | (2006.01) | |
| *C30B 11/00* | (2006.01) | |
| *C30B 13/06* | (2006.01) | |
| *C30B 29/52* | (2006.01) | |
| *C30B 13/30* | (2006.01) | |
| *C30B 13/24* | (2006.01) | |
| *C30B 13/32* | (2006.01) | |
| *B29C 64/153* | (2017.01) | |
| *G02B 6/42* | (2006.01) | |
| *B22F 12/00* | (2021.01) | |
| *B29L 31/08* | (2006.01) | |
| *B29K 105/00* | (2006.01) | |
| *B23K 101/00* | (2006.01) | |
| *B23K 103/18* | (2006.01) | |
| *B22F 10/10* | (2021.01) | |

(52) U.S. Cl.
CPC ...... *B23K 26/0006* (2013.01); *B23K 26/0608* (2013.01); *B23K 26/073* (2013.01); *B23K 26/34* (2013.01); *B23P 6/007* (2013.01); *B28B 1/001* (2013.01); *B29C 64/153* (2017.08); *B29C 73/00* (2013.01); *B29C 73/34* (2013.01); *B33Y 10/00* (2014.12); *B33Y 30/00* (2014.12); *C30B 11/005* (2013.01); *C30B 11/006* (2013.01); *C30B 11/007* (2013.01); *C30B 13/06* (2013.01); *C30B 13/24* (2013.01); *C30B 13/30* (2013.01); *C30B 13/32* (2013.01); *C30B 29/52* (2013.01); *F01D 5/005* (2013.01); *G02B 6/425* (2013.01); *G02B 6/4268* (2013.01); *B22F 10/10* (2021.01); *B22F 2301/15* (2013.01); *B22F 2999/00* (2013.01); *B23K 2101/001* (2018.08); *B23K 2103/26* (2018.08); *B29K 2105/251* (2013.01); *B29L 2031/08* (2013.01); *F05D 2230/31* (2013.01); *Y02P 10/25* (2015.11)

(56) References Cited

U.S. PATENT DOCUMENTS

| | | |
|---|---|---|
| 6,180,050 B1 | 1/2001 | Arai et al. |
| 6,292,251 B1 | 9/2001 | Holley et al. |
| 6,423,935 B1 | 7/2002 | Hackel et al. |
| 6,717,106 B2 | 4/2004 | Nagano et al. |
| 6,894,712 B2 | 5/2005 | Ishikawa et al. |
| 6,980,321 B2 | 12/2005 | Ramanujan et al. |
| 7,444,046 B2 | 10/2008 | Karlsen |
| 7,550,251 B2 | 6/2009 | McLean et al. |
| 8,509,933 B2 | 8/2013 | Steingart et al. |
| 2002/0090313 A1 | 7/2002 | Wang et al. |
| 2002/0149137 A1 | 10/2002 | Jang et al. |
| 2003/0214571 A1 | 11/2003 | Ishikawa et al. |
| 2007/0283786 A1 | 12/2007 | Kappmeyer |
| 2013/0136868 A1 | 5/2013 | Bruck et al. |
| 2013/0140279 A1 | 6/2013 | Bruck et al. |
| 2015/0165556 A1 | 6/2015 | Jones et al. |
| 2015/0233345 A1 | 8/2015 | Olsen et al. |
| 2016/0008922 A1 | 1/2016 | Schwarze |

FOREIGN PATENT DOCUMENTS

| | | |
|---|---|---|
| CN | 102039494 A | 5/2011 |
| DE | 199053000 A1 | 5/2001 |
| EP | 0740976 A1 | 11/1996 |
| GB | 2453945 A | 4/2009 |
| JP | 2009056511 A | 3/2009 |
| JP | 2011083822 A | 4/2011 |
| WO | 2013128416 A2 | 9/2013 |
| WO | 2015109102 A1 | 7/2015 |
| WO | 2015119692 A2 | 8/2015 |
| WO | 2015134075 A2 | 9/2015 |
| WO | 2016201309 A1 | 12/2016 |

OTHER PUBLICATIONS

International Search Report and Written Opinion issued in connection with related PCT Application No. PCT/US2014/068979 dated Dec. 17, 2015, 3 pp.

International Preliminary Report on Patentability issued in connection with related PCT Application No. PCT/US2014/068979 dated Jun. 21, 2016.

Office Action issued in connection with related CA Application No. 2932620 dated Apr. 10, 2017, 6 pp.

Notification of Reasons for Refusal issued in connection with related JP Application No. 2016-537994 dated Jun. 6, 2017, 7 pp.

Extended European Search Report and Opinion issued in connection with corresponding EP Application No. H153923-2 dated Jun. 8, 2017, 10 pp.

Machine Translation and Notification of Reasons for Refusal issued in connection with corresponding JP Application No. 2017-009925 dated Mar. 13, 2018, 5 pp.

First Office Action and Search issued in connection with corresponding CN Application No. 201710256503.9 dated Jun. 22, 2018, 14 pp.

Zhao Xinbao et al., "Influence of directional solidification variables on the microstructure and crystal orientation of AM3 under high thermal ingredient," Journal of Material Science, 45:6101-6107, Jun. 15, 2010.

CONTROL OF SOLIDIFICATION IN LASER POWDER BED FUSION ADDITIVE MANUFACTURING USING A DIODE LASER FIBER ARRAY

CROSS-REFERENCE TO RELATED APPLICATIONS

This application is a continuation and claims priority to U.S. patent application Ser. No. 15/014,713 filed Feb. 3, 2016 for CONTROL OF SOLIDIFICATION IN LASER POWDER BED FUSION ADDITIVE MANUFACTURING USING A DIODE LASER FIBER ARRAY, which claims priority to U.S. patent application Ser. No. 14/106,970 filed Dec. 16, 2013 for DIODE LASER FIBER ARRAY FOR POWDER BED FABRICATION OR REPAIR, and now issued as U.S. Pat. No. 10,328,685 on Jun. 25, 2019, both of which are hereby incorporated by reference in their entirety.

BACKGROUND

The present technology relates generally to the use of a diode laser fiber array for laser powder bed fusion additive manufacturing, for example Direct Metal Laser Melting (DMLM), for use in the fabrication or repair of components, more particularly components of a gas turbine engine.

Additive manufacturing is a known technology that enables the "3D-printing" of components of various materials including metals, ceramics and plastics. In additive manufacturing, a part is built in a layer-by-layer manner by leveling metal powder and selectively fusing the powder within a layer using a high-power laser or electron beam. After each layer, more powder is added and the laser patterns the next layer, simultaneously fusing it to the prior layers to fabricate a complete component buried in a powder bed. Additive manufacturing systems and processes are used to fabricate precision three-dimensional components from a digital model.

In making a build in current powder bed systems, the laser beam or electron beam is used to scan a layer of powder to sinter and melt the desired pattern in the layers of the powder bed. The typical scanning time for such systems per layer is in the range of 70-100 seconds. For some applications, the build can require days of processing time. One application of DMLM is in the fabrication and repair of airfoils for gas turbine engines for aircraft. The geometries of the airfoils are difficult to form using conventional casting technologies, thus fabrication of the airfoils using a DMLM process or an electron-beam melting process has been proposed. With the layers built upon one another and joined to one another cross-section by cross-section, an airfoil or portion thereof, such as for a repair, with the required geometries, may be produced. The airfoil may require post-processing to provide desired structural characteristics.

Another problem of laser scanning Direct Metal Laser Melting (DMLM) systems is rapid cooling rates that can lead to cracking of certain alloys during the additive manufacturing build process. Rapid cooling rates also present difficulties in obtaining desirable grain morphology, pattern and size, for example equiaxed or columnar grains, grain growth that is normal to the layer surface.

BRIEF DESCRIPTION

In accordance with one example of the technology disclosed herein, a method of forming or repairing a superalloy article having a columnar or equiaxed or directionally solidified or amorphous or single crystal microstructure comprises emitting a plurality of laser beams from selected fibers of a diode laser fiber array corresponding to a pattern of a layer of the article onto a powder bed of the superalloy to form a melt pool; and controlling a temperature gradient and a solidification velocity of the melt pool to form the columnar or single crystal microstructure.

In accordance with another example of the technology disclosed herein, a superalloy article or repair is formed by the method of the preceding paragraph.

DRAWINGS

Figure 1B:
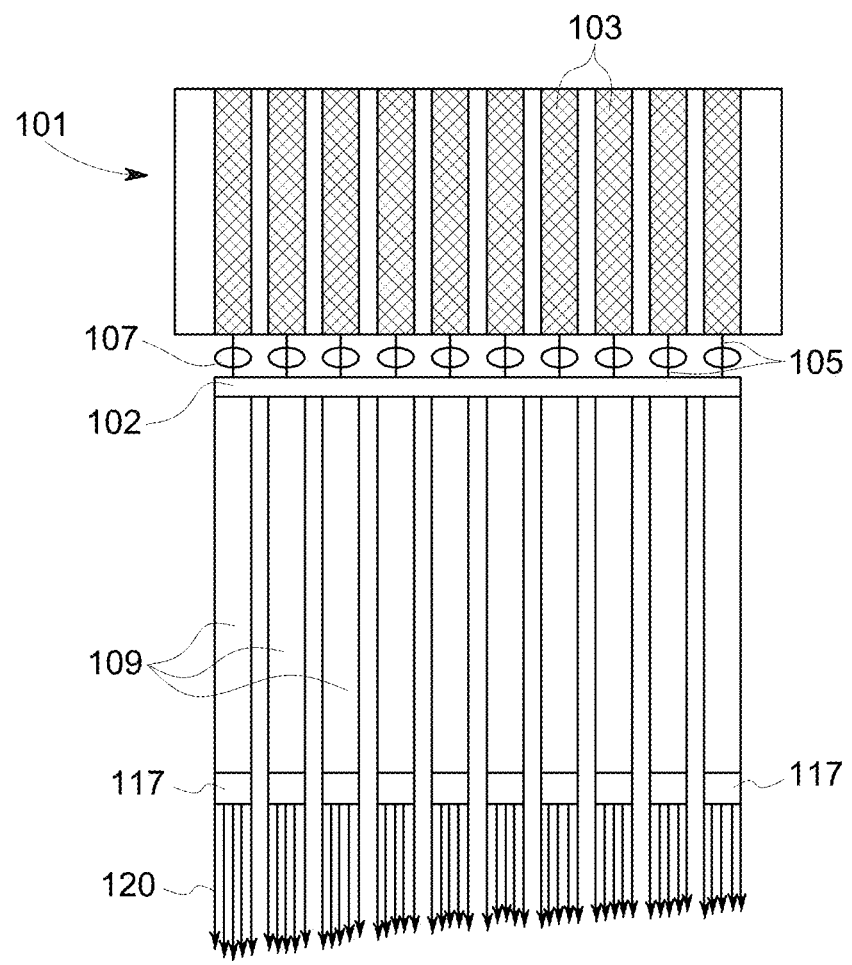
Figure 1C:
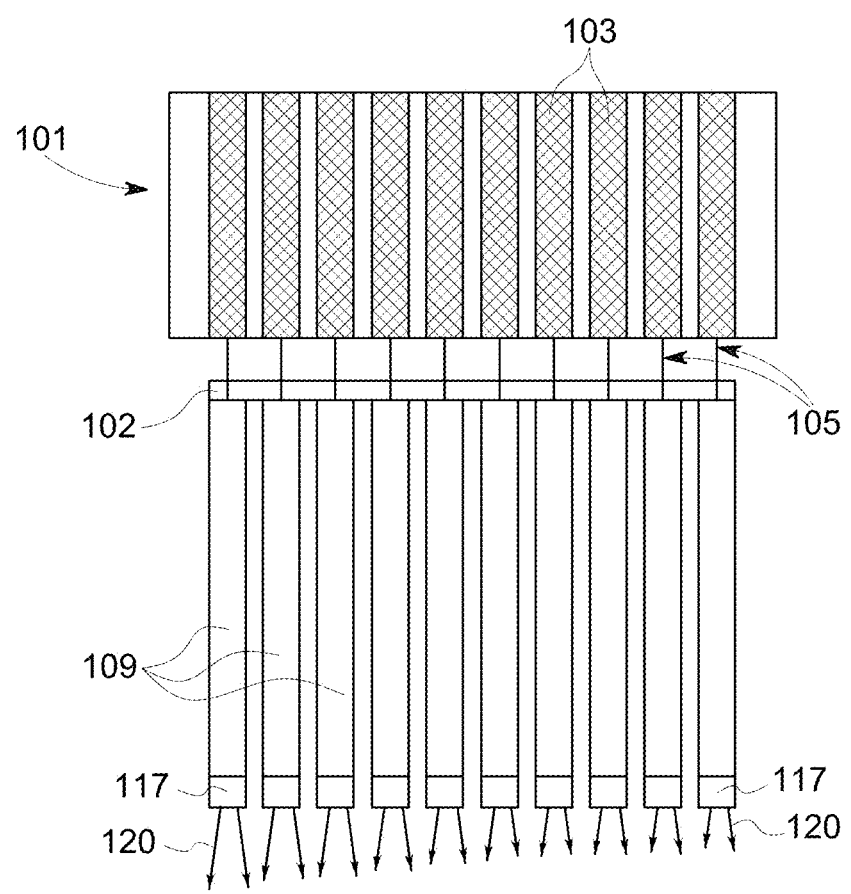
Figure 1D:
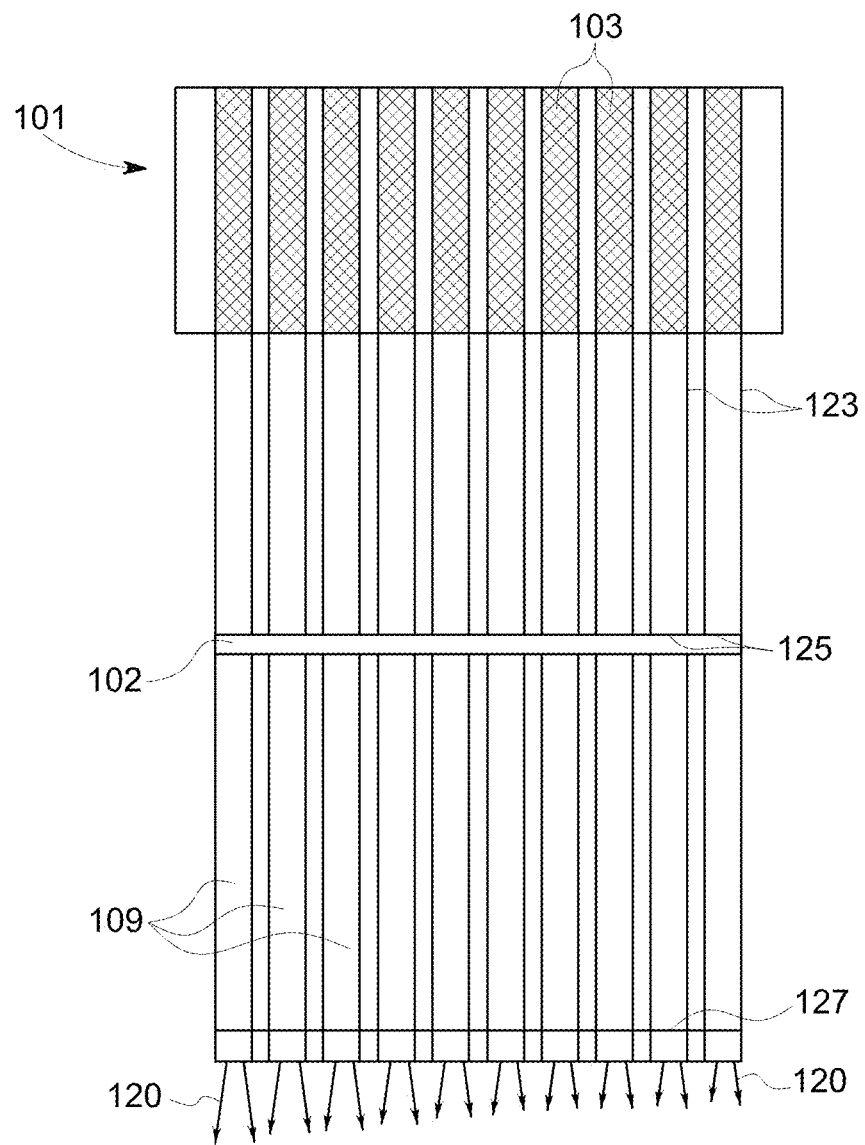
Figure 2:
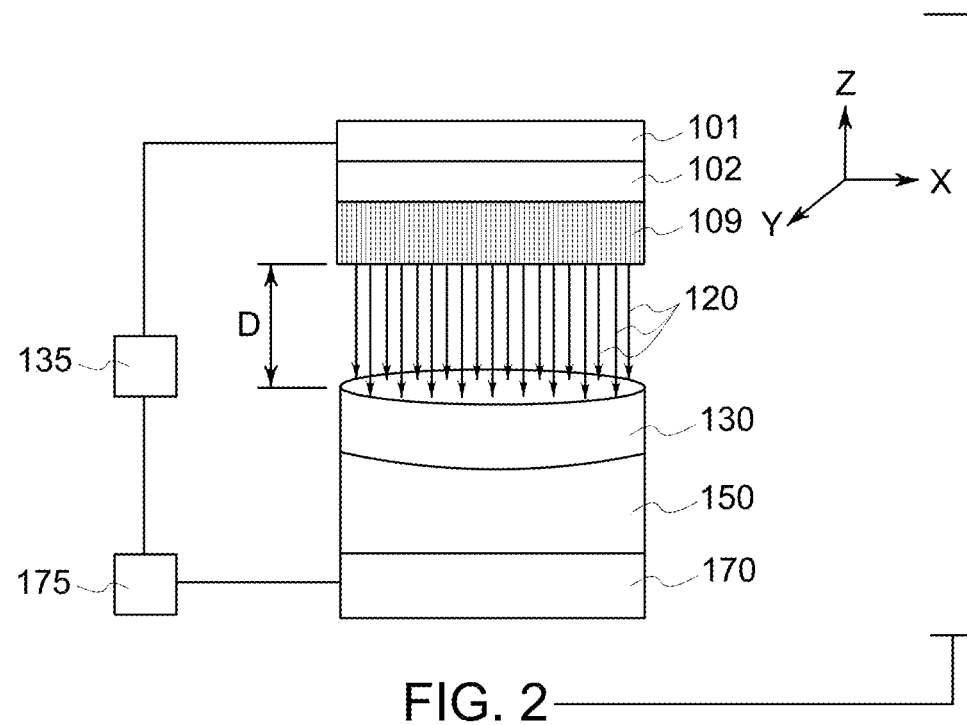
Figure 3:
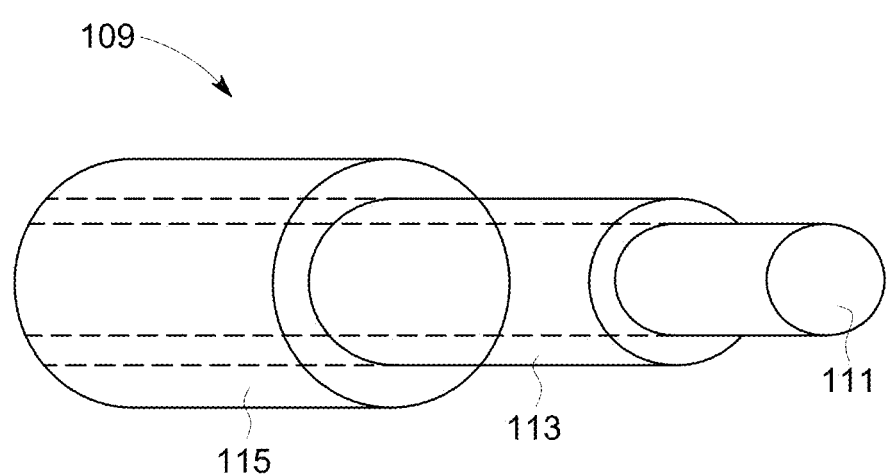
Figure 4A:
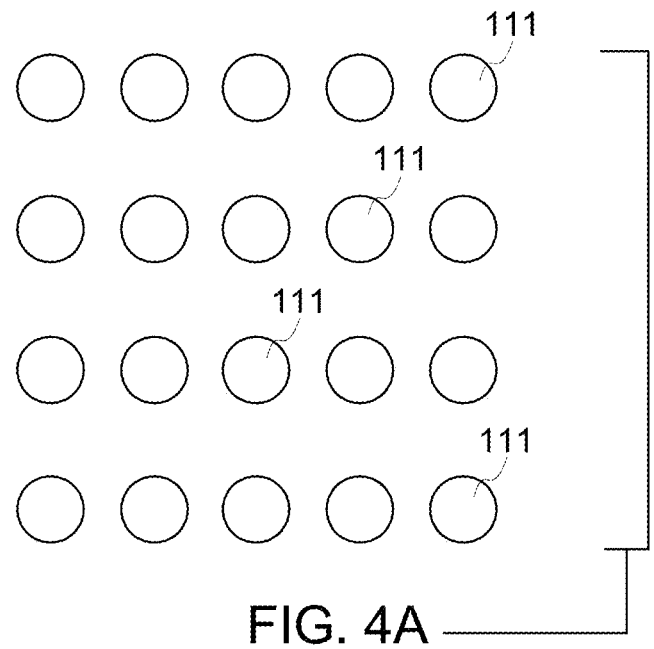
Figure 4B:
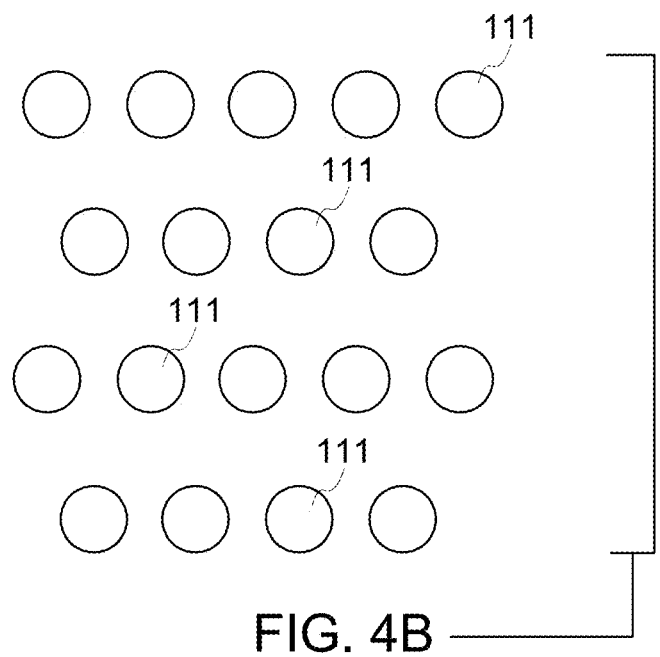
Figure 5:
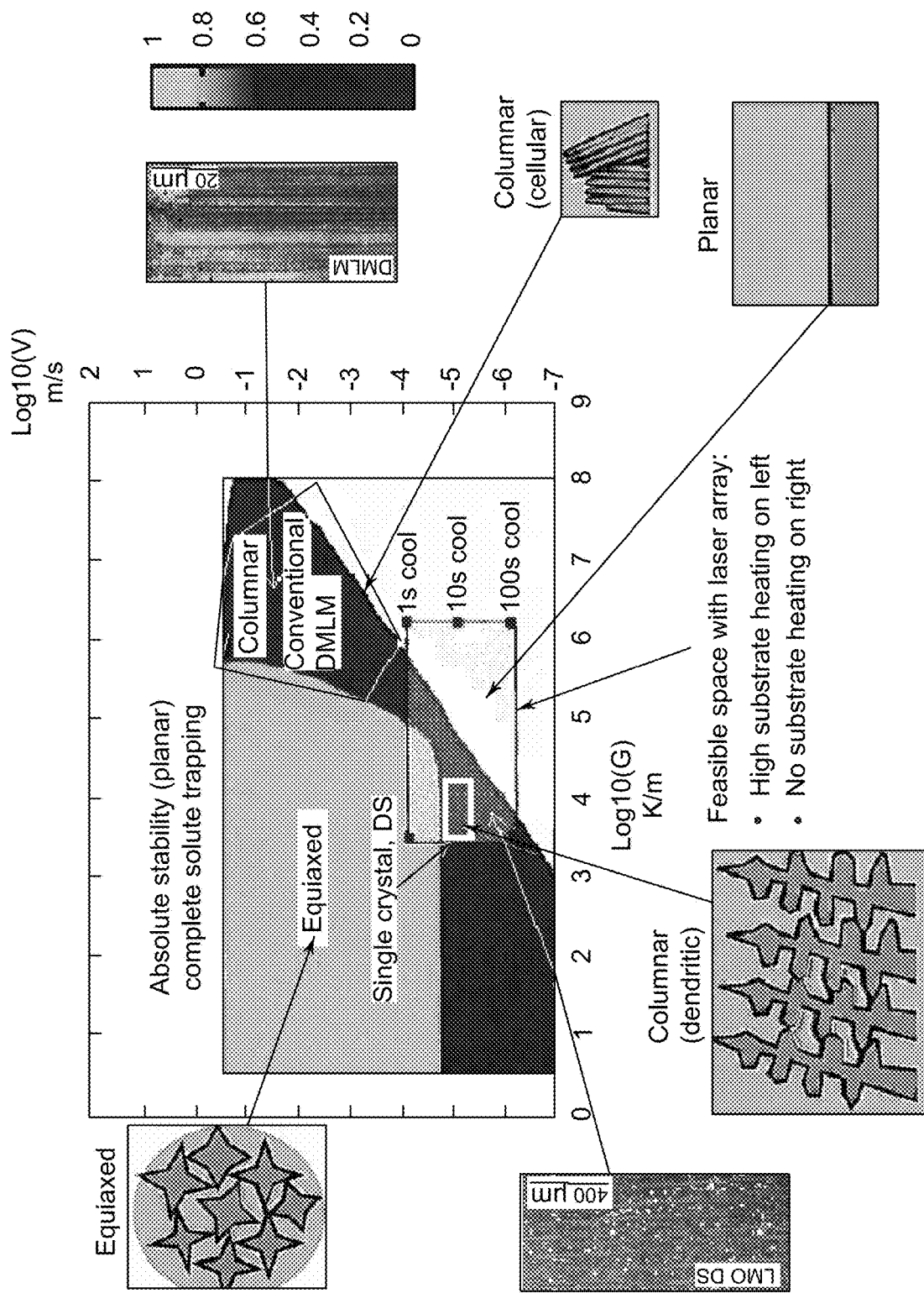

These and other features, aspects, and advantages of the present technology will become better understood when the following detailed description is read with reference to the accompanying drawings in which like characters represent like parts throughout the drawings, wherein:

FIG. 1A schematically illustrates a diode laser fiber array for use with the present technology;

FIG. 1B schematically illustrates another diode laser fiber array for use with the present technology;

FIG. 1C schematically illustrates another diode laser fiber array for use with the present technology;

FIG. 1D schematically illustrates another diode laser fiber array for use with the present technology;

FIG. 2 schematically illustrates a system for simultaneous melting of a pattern in a powder bed layer by a diode laser fiber array according to an example of the present technology;

FIG. 3 schematically illustrates a fiber optic construction usable in a diode laser fiber array according to an example of the present technology;

FIG. 4A schematically illustrates a fiber array usable with the system according to the present technology;

FIG. 4B schematically illustrates another fiber array usable with the system according to the present technology:

FIG. 5 is a Columnar to Equiaxed (CET) diagram of microstructures as a function of thermal gradient (G) and solidification velocity (V) that may be formed using the diode laser fiber array of the present technology.

DETAILED DESCRIPTION

Referring to FIG. 1A, a diode laser array 101 (e.g., a diode laser bar, fiber pigtail, or stack) includes a plurality of diode lasers, or emitters, 103, each emitting a beam of laser energy 105. A plurality of spherical lenses 107 are positioned between the diode lasers 103 and a plurality of optical fibers 109 to couple laser energy from each diode laser 103 to an optical fiber 109. The optical fibers 109 may be provided in a bundle 102 between the diode lasers and the free ends of the optical fiber array, as shown for example in FIGS. 1A-1C. However, it should be appreciated that diode fiber laser arrays that do not use coupling optics may be used with the present technology, as discussed below.

Referring to FIG. 1B, the diode laser fiber array 101 may include lenses 117 at the ends of the optical fibers 109. The lenses 117 may be configured to provide collimated laser beams 120 from the optical fibers 109. Referring to FIG. 1C, the diode laser fiber array 101 may not include optics (e.g. a lens) between the diode lasers 103 and the optical fibers 109 and the beams of laser energy 105 may be received by the optical fibers 109 in proximity to the diode lasers 103. The optical fibers 109 may have lenses 117 at their respective ends. The lenses 117 may be configured to provide a predetermined divergence to the laser beams 120 emitted from the optical fibers 109. It should also be appreciated that instead of providing lenses, the ends of the optical fibers 109 may be shaped to provide collimated or divergent laser beams 120. Referring to FIG. 1D, the diode lasers may include fiber pigtails 123 that are spliced 125 into the input of optical fibers 109. An f-theta lens collimates the exiting laser beams 120 from the fiber array.

Referring to FIG. 2, the diode laser fiber array 101 directs laser beams 120 from the optical fibers 109 into a powder bed 130 to simultaneously melt all of the desired powder in a layer. To generate a desired pattern, for example of a repair or a component to be fabricated, the required diode lasers 103 are turned on to affect the desired simultaneous melting from each fiber 109. The melting process time for the desired pattern may be less than a second, which is at least two orders of magnitude faster than current scanning processes.

The powder bed 130 may be provided for a component 150, for example an airfoil of a gas turbine engine of an aircraft, which is supported on a support 170 to provide a repair to the component. Although the present technology may be applicable to the repair function on components, it should be appreciated that the present technology is applicable for the additive manufacturing build of new make components. The powder bed may be provided on the support 170 and the diode laser fiber array 101 used to build or fabricate the component layer by layer.

The support 170 may be moved by an actuator or an actuator system 175 that is configured to move the support 170 in the Z direction (i.e. normal to the powder bed 130) as shown in FIG. 2. The actuator or actuator system 175 may also be configured to move the support 170 in the XY plane as shown in FIG. 2, although the support 170 is not moved in the XY plane during simultaneous melting of the powder bed from each fiber 109. The actuator or actuator system 175 may be controlled by controller 135 that is configured to control the actuator or actuator system 175 and the diode laser fiber array 101. The actuator or actuator system 175 may include, for example, a linear motor(s) and/or hydraulic and/or pneumatic piston(s) and/or a screw drive mechanism (s) and/or a conveyor. As the diode laser fiber array 101 is capable of simultaneously melting all of the required powder in the layer for a pattern, there is no need to move either the array 101 or the powder bed 130 during melting, for example as is done with current systems in which a laser beam or electron beam is used to scan a layer of powder.

The distance D between the array of optical fibers 109 (i.e. the ends of the optical fibers 109) and the powder bed 130 may be controlled by moving the support 170 in the Z direction. The distance D may depend on the type of laser beams 120 emitted by the optical fibers 109 (e.g. whether the laser beams 120 are collimated or divergent, and the amount of divergence), the average output power of each diode laser 103, the pulse energy of each diode laser 103, the pulse width of each diode laser 103, and/or the beam mode (e.g. Gaussian, top hat, etc. distribution). The ends of the optical fibers 109 may be located at, for example, about 5 mm to about 150 mm, for example about 20 mm to about 80 mm above the powder bed 130 so that any region of a layer of the powder bed 130 can be melted at the same time by turning the required diode lasers 103 on at the same time.

The controller 135 controls the turning on and turning off of each diode laser 103, and the initial power of each diode laser. The controller may also control the rate at which the power of each diode laser 103 is reduced when turned off. The controller 135 may turn each diode laser 103 on and off within a time frame of, for example, about 5 to 15 milliseconds, or longer if needed. For a given layer of powder 130, for example above an airfoil to be repaired, the desired laser diodes 103 are activated to melt the powder in the desired shape per a CAD design, which may be input and/or stored in the controller 135. This process may be repeated as many times as necessary to build up the required repair region. In the case of the system being used to fabricate a component, e.g. an airfoil, the process is repeated as many times as necessary to build the component. The controller 135 controls the actuator or actuator 175 to move the support 170 downwardly as layers of powder are added and subsequently processed by the diode laser fiber array. Each layer formed may be, for example, about 1 μm to about 1 mm thick. In the case of repair of an airfoil, each layer may be formed, for example, about 100 μm thick.

The controller 135 may be a computer processor or other logic-based device, software components (e.g., software applications), and/or a combination of hardware components and software components (e.g., a computer processor or other logic-based device and associated software application, a computer processor, or other logic-based device having hard-wired control instructions, or the like).

The diode laser fiber array 101 may be controlled by the controller 135 to control the temperature of powder near or adjacent to the melted region to control the cooling rate of the melted region. The controller 135 may also control the diode laser fiber array 101 to preheat the powder bed 130 and/or the component 150. The pre-heating power densities of the diode lasers 103 may be from about 100-100,000 watts/cm$^2$ the powder bed 130 and/or the component 150 and/or heating the region near or. By preheating adjacent to the melt region, the thermal gradient may be controlled to be substantially only in the direction normal to the powder bed (i.e. in the Z direction in FIG. 2). This may help with materials that are crack sensitive to fast solidification cooling rates. Desirable grain growth that is normal to the layer surface may be achievable with planar cooling of a powder bed layer. This allows formation of a directionally solidified (DS) type grain structure or a single crystal structure with the build repair of an airfoil type structure. It should also be appreciated that the diode lasers 103 may be controlled to heat the powder bed 130 to control the temperature and temperature gradient of the melted region. Controlling the temperature and the temperature gradient of the melted region allows control over, for example, evaporation of the powder, the grain structure of the solidified layer, and/or the surface finish of the repair or component. Spatial control of the cooling rates in the 2D plane of each build layer allows the grain structure of each build layer to be controlled, as well as the grain structure in 35 as the build layers are added to form the build. Spatial control of the cooling rates in the 2D plane of each build layer also enables special treatments of the volumes that will form the surfaces of the 3D build or part. This allows control of the surface roughness and density (porosity) at the surface, which may improve mechanical properties of the part, for example fatigue.

The material in the powder bed 130 may be metal powder, for example, CoCrMo powder. It should be appreciated that other materials, for example plastic, ceramic, or glass, may be used for the powder bed. Depending on the material in the powder bed, the power of each diode laser 103 may be from about 10 to about 60 watts. The power of the diode lasers 103 that are used may be related to the diameter of the optical fibers 109 used. The power density from each diode laser fiber 103 may be up to about 1,000,000 watts/cm$^2$ for melting the powder within a layer from each fiber.

The fiber centering position in the fiber array (e.g. as shown in FIGS. 4A and 4B) is set by the diameter of a buffer, or coating 115 of the optical fiber 109. Referring to FIG. 3, the optical fiber 109 comprises a core 111, formed of for example silica, and cladding 113, formed for example of silica, around the core 111. In order to create a numerical aperture and provide total internal reflection within the fiber 109, the refractory index of the silica core may be larger than the refractory index of the silica cladding. For example, the silica core may have a refractive index of about 1.45 and the silica cladding may have a refractive index of about 1.43. The cladding 113 may have a thickness of about 10 μm.

The buffer, or coating, 115 surrounds the cladding 113 and may be formed of, for example, acrylate. To reduce the center spacing between the optical fibers 109, the buffer (acrylate coating) 115 may be replaced by a thinner acrylate coating to reduce the overall fiber diameter. The thickness of the buffer, or coating 115 may be about 62 μm. The total diameter of the fiber 109 may be about 200 μm to about 250 μm.

The diameter of the fiber core 111 may be about 105 μm. It should be appreciated that fiber core diameters of about 60 μm may be used. In addition, it should be appreciated that optical fibers 109 of various cross sections, may be used. For example, square or hexagonal fibers may be used to increase fiber packing. The melt pool size produced by the laser beam(s) 120 from each optical fiber 109 corresponds to the effective laser spot size produced by the laser beam(s) 120. In the case of collimated laser beams 120, the melt pool size corresponds generally to the diameter of the fiber core 111. However, the laser beams 120 from the fibers I 09 may be controlled to produce a melt pool size that is, for example, two to four times as large as the diameter of the fiber core 111. The laser beams 120 may be controlled to have a divergence to provide a melt pool size larger than the diameter of the fiber core 111. In the case of divergent laser beams 120, the distance D from the ends of the fibers 109 of the array 101 to the powder bed 130 will also influence the melt pool size of each fiber. The pulse width of the laser beams and the laser beam mode distribution may also be controlled to adjust the melt pool size provided by each fiber.

Referring to FIGS. 4A and 4B, the array of fibers 109 may be linear as shown in FIG. 4A or closed packed arrangement as shown in FIG. 4B. Other arrays, for example hexagonal, may be used. It should also be appreciated that the array may be in a shape corresponding to the shape of a component to be fabricated. The spacing between the fibers 109 may be equal to the diameter of the buffer, or coating, 115.

As discussed herein, the use of superalloys for repair and/or build of components such as gas turbine blades is desirable due to their excellent mechanical strength, resistance to thermal creep deformation, good surface stability and resistance to corrosion or oxidation. Single crystal superalloys are currently used due to their ability withstand loading at temperatures near their melting point, their creep and oxidation resistance. Components formed of single crystal superalloys are currently formed using techniques such as Bridgman casting.

Referring to FIG. 5, microstructures that may be formed using the diode laser fiber array of the present technology are shown as a function of thermal gradient (G) along the X-axis and the solidification velocity (V) along the Y-axis. As shown, conventional DMLM systems and processes, for example done by single laser scanning, generally produce a microstructure that is columnar for Ni-based superalloys. Conventional DMLM is generally regarded as high temperature gradient and high solidification velocity processing.

Certain conventional DMLM systems and processes may produce an equiaxed structure. Planar growth occurs in the space above and below the equiaxed and columnar regions shown in the figure. High solidification rates in the top region of the figure result in complete solute trapping, as limited time is available for chemical inhomogeneities to occur. The constitutional undercooling limit is shown the lower right of the figure and planar growth is expected to occur in this region where a flat interface between the liquid and solid results with no branching. Reducing the amount of undercooling needed for nucleation expands the equiaxed region, while increasing the amount reduces the equiaxed region.

Referring still to FIG. 5, the inventors have discovered that a region of the CET diagram in the mid- to high-temperature gradient and the low- to high-velocity solidification front may provide single crystal, directionally solidified (DS) superalloys. The microstructure may be obtained by controlling the thermal gradient G and the solidification velocity V of the melt pool using a diode laser fiber array system and processes as disclosed herein. The rectangular area shown in the figure defines a range of microstructures that may be obtained. The cooling rate may vary from 0.1 s (second) to 100 s. The microstructure that may be obtained with these cooling rates span a region from high substrate heating shown on the left side of the rectangular area to no substrate heating shown on the right. The rectangular area shown in the figure could be further expanded upward and to the right, beyond the area indicated, by decreasing the thickness of the powder layer. As used herein the term "high substrate heating" means heating the substrate (the article or component beneath the powder bed) to a temperature close to, but below, the melting temperature of the substrate. It should be appreciated that a prior layer(s) of the material that is formed, or deposited, on the substrate may be heated, for example post-heated, to control, e.g. reduce, the cooling rate. These structures have a columnar, dendritic (i.e. branching or tree-like) structure. The grains produced by the systems and processes disclosed herein may be regarded as large, for example from 10 μm to 100 μm. Heating of the substrate may be performed by any suitable process, including radiant heating, induction heating, microwave heating, etc. In addition, the heating may be provided by the diode laser fiber array 101.

The temperature gradient G and the solidification velocity may be controlled by controlling a decay rate of the power of the diode laser fiber array. For example, for a 10 W average output power of each diode laser, the laser energy may decay, for example linearly, at a rate of 10 W/s (for a is cool, as shown in FIG. 5), or at rate of 1 W/s (for a 10 s cool, as shown in FIG. 5), or 0.1 W/s (for a 100 s cool, as shown in FIG. 5), but not limited to linear decay. As another example, the output from each diode laser may be decreased asymptotically to a set value, which may differ for each diode laser. It should also be appreciated that the output power of each laser diode may "instantaneously" decay, i.e. be turned off.

Other parameters that may be controlled to produce a single crystal, directionally solidified superalloy microstructure include laser mode distribution (e.g. Top-Hat or Gaussian) laser spot diameter, laser power, laser on-time, laser efficiency (a), and a centerline spacing between laser beams. It should be appreciated that the values (e.g. ranges) of the parameters may be dependent on the material. For example, the single crystal, directionally solidified microstructure shown in FIG. 5 may be produced using a Top-Hat mode distribution, a laser spot diameter of 0.05-0.2 mm, a laser power of 5-60 W, an on-time of 5-50 ms, an efficiency a of 0.5, and a 80 µm centerline spacing.

By controlling the parameters of the diode laser fiber array, the shape of the melt pool can be controlled to achieve a flat solidification front to provide a controlled DS solidification condition. The parameters may be controlled to achieve a quasi-static melt pool. The size, including the depth, of the melt pool may be dependent on the particle size of the powder. A melt pool having a depth of 20 µm to 150 µm and a width from 3-100,000 times the depth may be formed using the diode laser fiber array. Particle sizes of the powder usable with the systems and processes disclosed herein may range from 10 µm to 150 µm, for example a powder particle size for a Ni-based superalloy may be 40 µm.

Although the CET diagram of FIG. 5 is for a particular superalloy, it should be appreciated that other CET diagrams may be generated to determine the microstructures of other superalloys that may be formed using the systems and processes disclosed herein.

The diode laser fiber array of the present technology may be used to process a powder bed layer by exposing the layer with simultaneous laser energy from required diode laser beam sources. The present technology also allows melting the complete pattern in the layer in one time frame that could be less than a second and, when required, control the heat of the powder near and/or adjacent to the melted region to control the cooling rate of the melted region. The diode laser fiber array allows permits grain structure control. The commercial advantages for diode laser fiber array systems include fewer required systems to produce the same amount of parts as current systems and tailoring power bed systems to the size of the parts of interest. The technology disclosed herein may also be used to perform sintering, for example direct metal laser sintering.

The diode laser fiber array of the present technology also allows formation of microstructures over a region of mid- to high-temperature gradients and low- to high-solidification velocities, covering a large feasible region for equiaxed or columnar/dendritic (DS/SX), by controlling, inter alia, substrate temperature and laser power as a function of time.

It is to be understood that not necessarily all such objects or advantages described above may be achieved in accordance with any particular example. Thus, for example, those skilled in the art will recognize that the systems and techniques described herein may be embodied or carried out in a manner that achieves or optimizes one advantage or group of advantages as taught herein without necessarily achieving other objects or advantages as may be taught or suggested herein.

While only certain features of the present technology have been illustrated and described herein, many modifications and changes will occur to those skilled in the art. It is, therefore, to be understood that the appended claims are intended to cover all such modifications and changes.

What is claimed is:

1. A superalloy article or repair formed by a method comprising the steps of:
   emitting a plurality of laser beams, from first selected fibers of a diode laser fiber array, corresponding to a pattern of a first layer of the article onto a powder bed of a superalloy to form a first melt pool;
   distributing additional powder across the first layer;
   emitting a plurality of laser beams, from second selected fibers of the diode laser fiber array, corresponding to a pattern of a second layer of the article onto the powder bed to form a second melt pool over the first layer; and
   controlling a temperature gradient and a solidification velocity of the first and second melt pools such that each of the first and second layers has a columnar or equiaxed or directionally solidified or amorphous or single crystal microstructure, the controlling comprising controlling a decay rate of a laser energy of each of the plurality of laser beams to control a cooling period of the melt pool.

2. A superalloy article or repair according to claim 1, wherein the columnar microstructure is dendritic.

3. A superalloy article or repair according to claim 1, wherein grains of the microstructure have a size of 10 µm-100 µm.

4. A superalloy article or repair according to claim 1, wherein the superalloy is a CoCrMo material.

5. A superalloy article or repair according to claim 1, wherein the superalloy is a Ni-based superalloy.

6. A superalloy article or repair according to claim 1, wherein controlling the temperature gradient and solidification velocity comprises decreasing the laser energy at 10 W/s to provide a 1 s cooling period.

7. A superalloy article or repair according to claim 1, wherein controlling the temperature gradient and solidification velocity comprises decreasing the laser energy at 1 W/s to provide a 10 s cooling period.

8. A superalloy article or repair according to claim 1, wherein controlling the temperature gradient and solidification velocity comprises decreasing the laser energy at 0.1 W/s to provide a 100 s cooling period.

9. A superalloy article or repair according to claim 1, wherein controlling the temperature gradient and solidification velocity comprises heating a substrate that supports the powder bed and/or heating a prior layer of the article formed by solidification of a prior melt pool.

10. A superalloy article or repair according to claim 9, wherein heating the substrate comprises heating the substrate to a temperature below the melting temperature of the substrate.

11. A superalloy article or repair according to claim 1, wherein controlling the temperature gradient and the solidification velocity comprises controlling at least one of a duration of each laser beam, a pulse energy of each diode laser, a pulse width of each diode laser, an average output power of each diode laser, an energy distribution of each laser beam, power density of each laser beam, a rate of reduction of the power of each laser beam, and/or a distance of ends of the fibers from the powder bed.

12. A superalloy article or repair according to claim 1, wherein controlling the temperature gradient and a solidification velocity comprises emitting laser beams from fibers at least adjacent to the pattern of the layer and heating the powder adjacent to the powder of the layer to control a cooling rate of the melted powder.

13. A superalloy article or repair according to claim 12, wherein heating the powder adjacent to the powder of the layer comprises heating the powder at least one of prior to and/or during and/or after simultaneous melting of the powder of the pattern of the layer.

14. A superalloy article or repair according to claim 12, wherein a power density of the laser beams heating the powder adjacent the pattern is in a range of from about 100 $W/cm^2$ to about 100,000 $W/cm^2$.

15. A superalloy article or repair according to claim 1, further comprising:
   moving the selected fibers and the powder bed relative to each other; and controlling the laser beams of the selected fibers during relative movement.

16. A superalloy article or repair according to claim 1, wherein controlling the temperature gradient and the solidification velocity to form the columnar or single crystal microstructure comprises controlling a cooling rate of each layer in two dimensions.

17. A superalloy article or repair according to claim 16, wherein controlling the cooling rate of each layer in two dimensions comprises controlling a cooling rate of a layer that forms a surface layer of the article or repair to have at least one of a predetermined surface roughness and density.

18. A superalloy article or repair according to claim 1, wherein controlling the temperature gradient and the solidification velocity comprises decreasing an output of each of the plurality of laser beams asymptotically towards a set value to control a cooling period of the melt pool.

19. A superalloy article or repair according to claim 1, wherein the superalloy article is a turbine component.

20. A superalloy article or repair according to claim 19, wherein the turbine component is an airfoil.

\* \* \* \* \*